United States Patent
Ono (10) Patent No.: US 7,911,804 B2
(45) Date of Patent: Mar. 22, 2011

(54) CIRCUIT BOARD AND METHOD OF MANUFACTURING SAME

(75) Inventor: Atsushi Ono, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 332 days.

(21) Appl. No.: 12/076,894

(22) Filed: Mar. 25, 2008

(65) Prior Publication Data

US 2008/0236882 A1    Oct. 2, 2008

(30) Foreign Application Priority Data

Mar. 30, 2007   (JP) ................. 2007-094984

(51) Int. Cl.
    *H05K 7/00*    (2006.01)
(52) U.S. Cl. ........ 361/777; 361/760; 361/783; 174/263; 174/534; 174/538; 174/557; 174/558
(58) Field of Classification Search .............. 174/260, 174/253, 254, 261, 263, 267, 520, 534, 535, 174/538, 558, 557, 262, 527, 536, 549; 260/760, 260/748, 767, 768, 777, 783, 807, 808; 257/672, 257/673, 676, 733, 737, 775, 786, 779, 784, 257/781, 780, 776; 361/760, 748, 767, 768, 361/777, 783, 807, 808; 29/877
See application file for complete search history.

(56) References Cited

U.S. PATENT DOCUMENTS

| 5,719,449 | A  | * | 2/1998 | Strauss ...................... 257/786 |
| 6,222,738 | B1 |   | 4/2001 | Maeno et al. |
| 6,229,711 | B1 |   | 5/2001 | Yoneda |
| 6,556,454 | B1 | * | 4/2003 | D'Amato et al. ............. 361/777 |
| 6,700,208 | B1 | * | 3/2004 | Yoneda ...................... 257/779 |

FOREIGN PATENT DOCUMENTS

| JP | 60-218751 A  | 11/1985 |
| JP | 7-074459     | 3/1995  |
| JP | 9-293957     | 11/1997 |
| JP | 2001-127198 A | 5/2001 |
| JP | 2005-011902  | 1/2005  |

* cited by examiner

*Primary Examiner* — Dameon E Levi
*Assistant Examiner* — Hoa C Nguyen
(74) *Attorney, Agent, or Firm* — Nixon & Vanderhye, P.C.

(57) ABSTRACT

The present invention provides a circuit board and a method for manufacturing the circuit board, the circuit board and method allowing a further shorter connection distance between electrodes of a semiconductor device, and also allowing a sufficient thickness of a solder pre-coat in a soldering process. The circuit board comprises bonding pads for being connected with bumps of a semiconductor element, which act as connection terminals, the bonding pads being arrayed in parallel lines on a surface of the circuit board, and, on the adjacent parallel lines, the bonding pads being positioned to form a zigzag pattern along the parallel lines longitudinally.

9 Claims, 12 Drawing Sheets

PRIOR ART

F I G. 8 (a)

PRIOR ART

PRIOR ART

FIG. 10(a)

PRIOR ART

FIG. 10(b)

PRIOR ART

FIG. 11 (a)

PRIOR ART

CIRCUIT BOARD AND METHOD OF MANUFACTURING SAME

This Nonprovisional application claims priority under 35 U.S.C. §119(a) on Patent Application No. 094984/2007 filed in Japan on Mar. 30, 2007, the entire contents of which are hereby incorporated by reference.

FIELD OF THE INVENTION

The present invention relates to a circuit board and a method of manufacturing the same, in particular, to a shape of electrodes formed on a board on which a flip-chip is to be mounted.

BACKGROUND OF THE INVENTION

With semiconductor devices becoming lighter, thinner and smaller, necessary components of devices have been miniaturized significantly.

Conventionally, a wire bonding method is used for electrical connections between a semiconductor chip and a circuit board. Japanese Unexamined Patent Application Publication No. 11-121526 (published on Apr. 30, 1999) (Patent Document 1) discloses a technique, with which, to electrode pads formed on a miniaturized semiconductor chip, gold wires are wire-bonded at bonding positions shifted alternately, so as to have a wide gap between the gold wires. With this arrangement, a short-circuit between the gold wires can be prevented.

However, the wire bonding method requires a circuit board to have a region for wire bonding, outside of the region where the semiconductor chip is mounted. Therefore, a package size is not compact.

In order to reduce the area of the region for wire bonding, a flip-chip bonding method is proposed.

In the flip chip bonding method, bumps are formed on that surface (active element side) of a semiconductor chip on which active elements are to be provided. The active element side of the semiconductor chip and a circuit board are positioned to face each other, and the bumps and bonding pads formed on the circuit board are bonded together thereafter.

A C4 method and an ACF (anisotropic conductive film) method, with which an anisotropic conductive film is formed on a board for bonding, are typical flip-chip bonding methods.

Figure 8A:
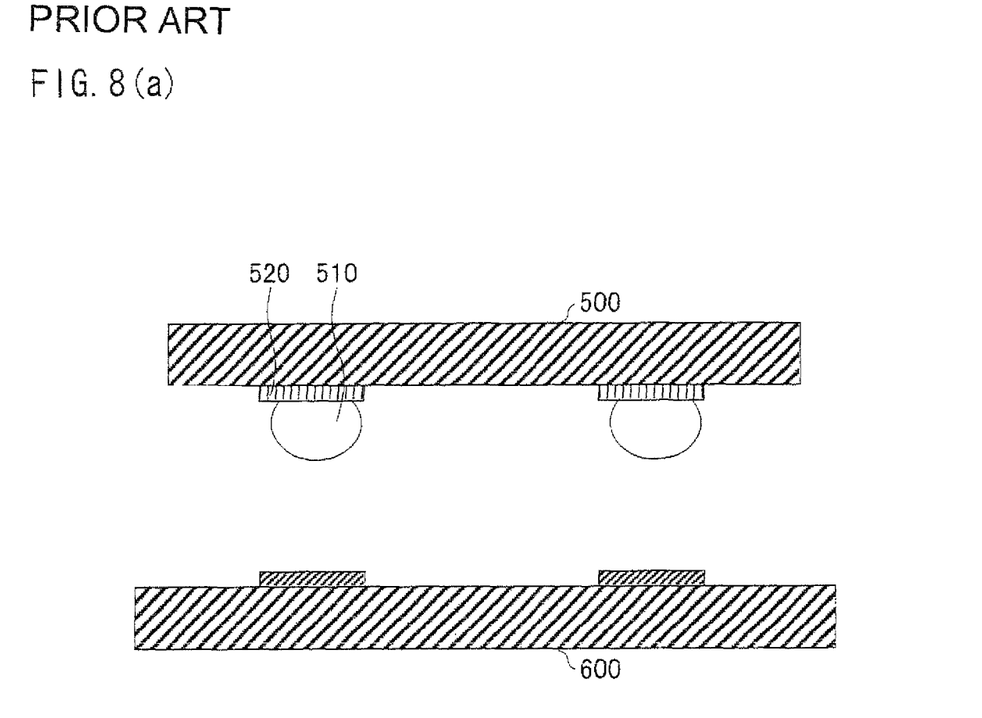
FIG. 8(a) is a cross-section view of a conventional semiconductor device.
Figure 8B:
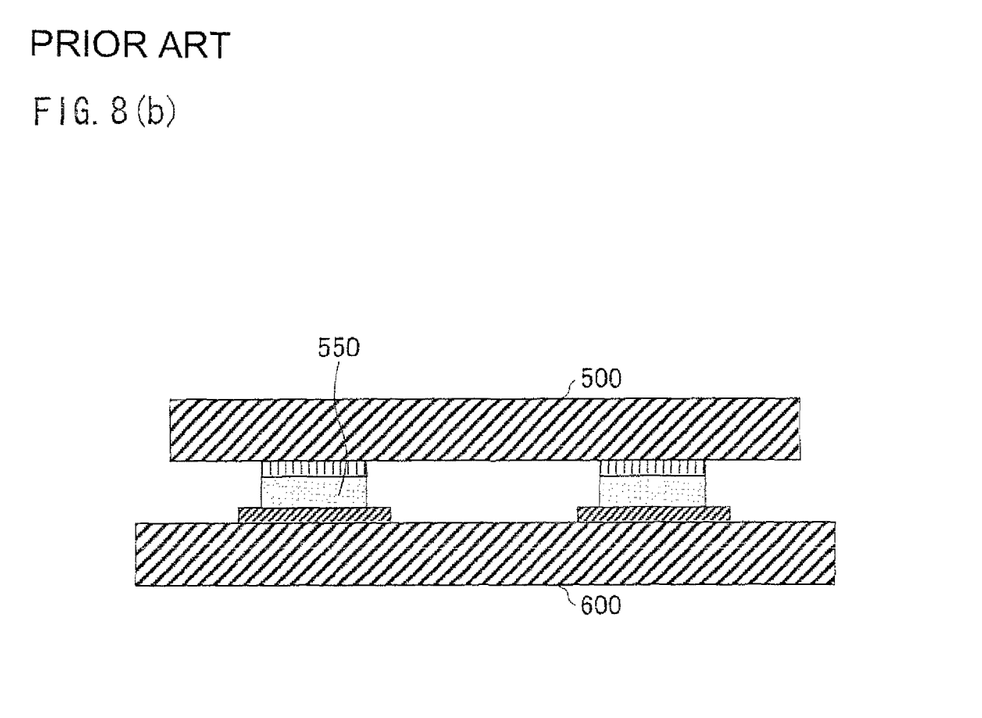
FIG. 8(b) is a cross-section view of a conventional semiconductor device.

FIGS. 8(a) and 8(b) are cross section views of a semiconductor device formed according to the C4 method.

In the C4 method, as FIG. 8(a) shows, a solder bump 510 is formed on an electrode pad 520, which is formed on a semiconductor chip 500. The semiconductor chip 500, on which the solder bump 510 is formed, and a circuit board 600 are positioned to face each other, and heated in a reflow furnace thereafter. The solder bump 510 is melted with the heat. As illustrated in the cross section view in FIG. 8(b), molten solder 550 bonds the semiconductor chip 500 and the circuit board 600 together.

Described below are the process of forming the solder bumps described above, for example. First of all, a wafer with a passivation film is sputtered with metal that will acts as a seed layer and a barrier metal layer in a plating process. Then, a plating mask is formed with photoresists. After that, electroplating with solder is carried out. Thereafter, the photoresists are removed and the seed metal is etched at the same time. Finally, the solder is melted with a reflow process, so as to make bumps.

Figure 9A:
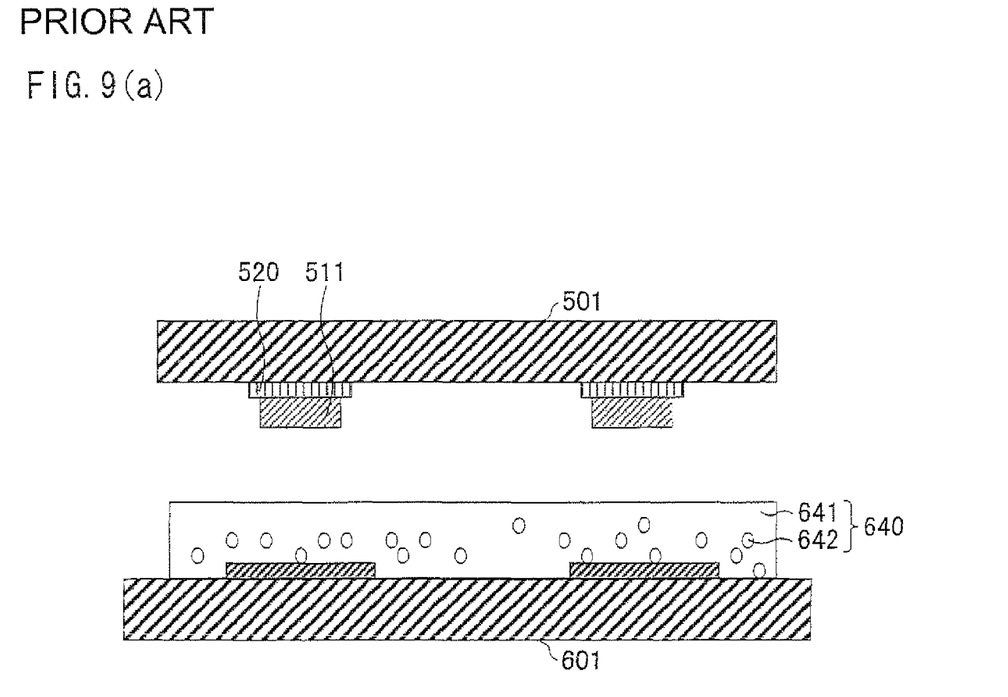
FIG. 9(a) is a cross-section view of a conventional semiconductor device.
Figure 9B:
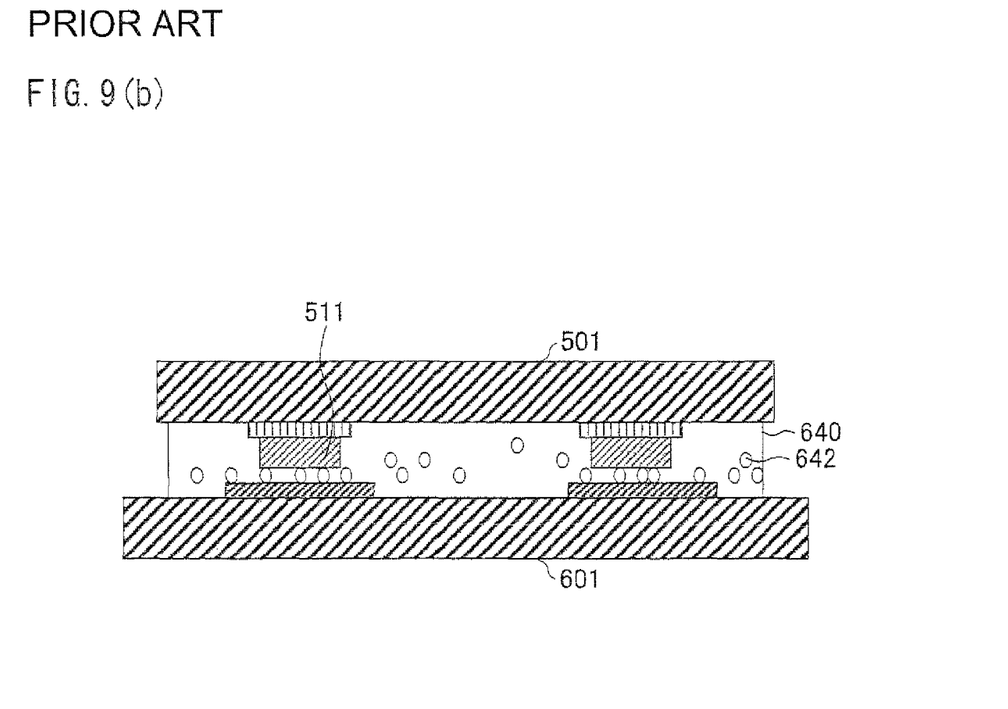
FIG. 9(b) is a cross-section view of a conventional semiconductor device.

FIGS. 9(a) and 9(b) are cross section views of a semiconductor device formed according to the ACF method.

As a cross section view FIG. 9(a) shows, in the ACF method, an ACF 640, where conductive particles 642 (such as resin balls coated with Au/Ni) are dispersed in a film-shaped binder resin 641, is attached to a circuit board 601. In addition, a bump 511 is formed on an electrode pad 520 of a semiconductor chip 501. As FIG. 9(b) shows, the semiconductor chip 501 and the circuit board 601 are pressure-bonded together with their active element side faced each other. At this time, the semiconductor chip 501 is pressured against the circuit board 601 under heat application with the ACF 640 between them. As a result, the conductive particles 642 are provided in between the bump 511 and the circuit board 601. With this arrangement, the conductive particles 642 connect the semiconductor chip 501 to the circuit board 601.

However, these methods have problems as follows.

For example, in the C4 method, the reflow process is needed for bonding a semiconductor chip to a circuit board. In the reflow process, it is difficult to use an organic circuit board because the semiconductor chip and the circuit board are heated.

In addition, it is also difficult to shorten (fine-pitch) the distance between the solder terminals, because the solder bumps should be formed. Moreover, a process for washing off flux is needed after bonding the semiconductor chip to the circuit board, because flux is used in the bonding process. As an unfortunate result, the whole process gets complicated.

The ACF method has a problem as well. In the ACF method, the semiconductor chip 501 and the circuit board 601 have electrical connections with the conductive particles 642, which are provided in between the bump 511 and the circuit board 601. The conductive particles 642 make the electrical connections by being in contact with the semiconductor chip 501 to the circuit board 601. Therefore, the semiconductor chip 501 to the circuit board 601 would easily have various contact resistances at different locations where they are connected with each other.

Consequently, the flip-chip bonding method adopting a local reflow method has been gaining attention in recent years.

Figure 10A:
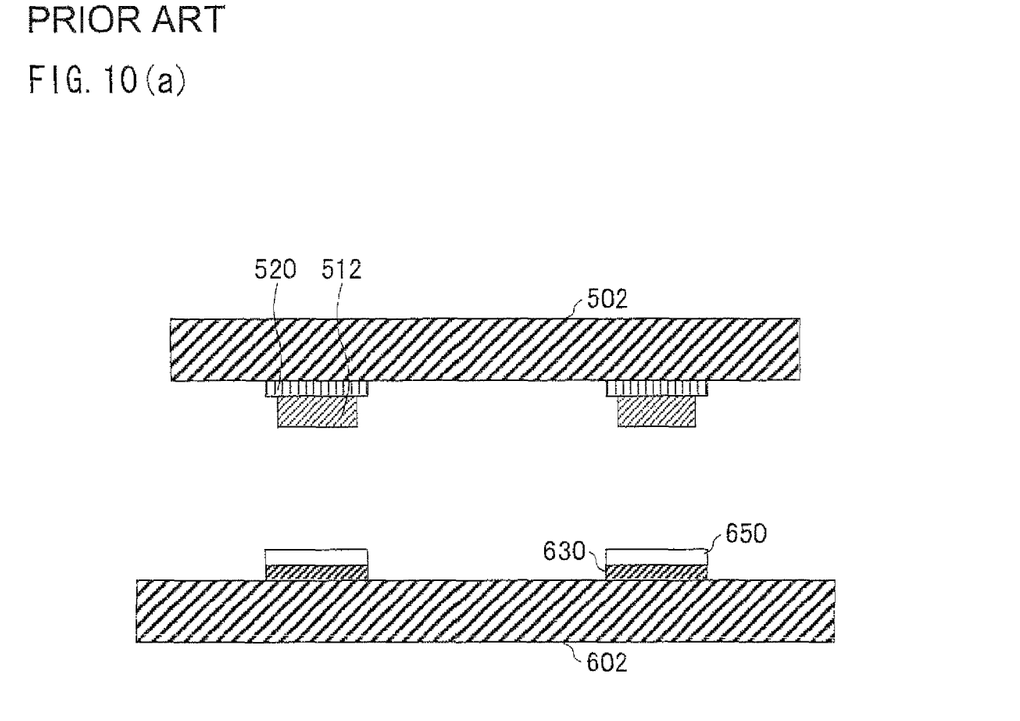
FIG. 10(a) is a cross-section view of a conventional semiconductor device.
Figure 10B:
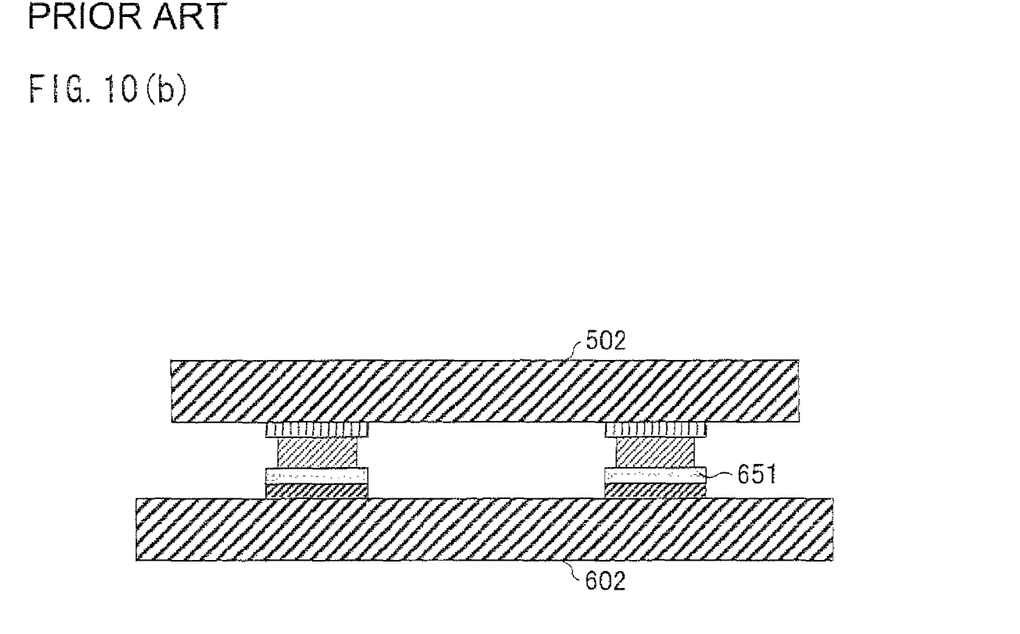
FIG. 10(b) is a cross-section view of a conventional semiconductor device.

FIGS. 10(a) and 10(b) are cross section views showing a semiconductor device formed according to the local reflow method.

As FIG. 10(a) shows, with the local reflow method, a gold (AU) wire bump 512 is formed on an electrode pad 520 of a semiconductor chip 502. In addition, solder pre-coat 650 is performed on a bonding pad 630 formed on a circuit board 602. As illustrated in FIG. 10(b), the semiconductor chip 502 and the circuit board 602 are heated and pressured. As a result, molten solder 651 solders the semiconductor chip 502 and the circuit board 602 together. Unlike the C4 method, the local reflow method makes it possible to solder without using flux.

Figure 11A:
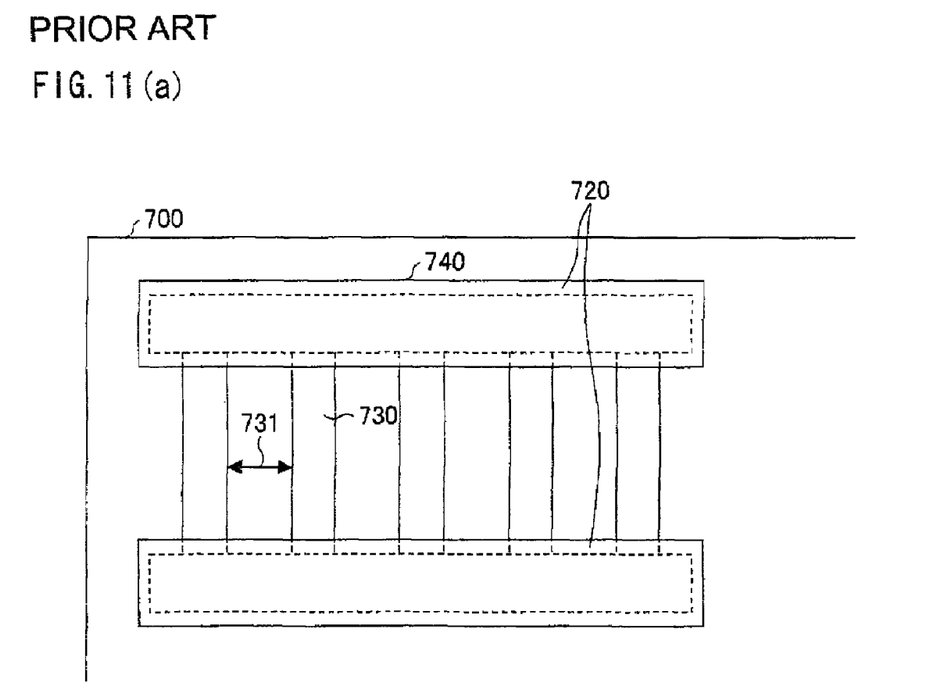
FIG. 11(a) is a plan view of a conventional circuit board.
Figure 11B:
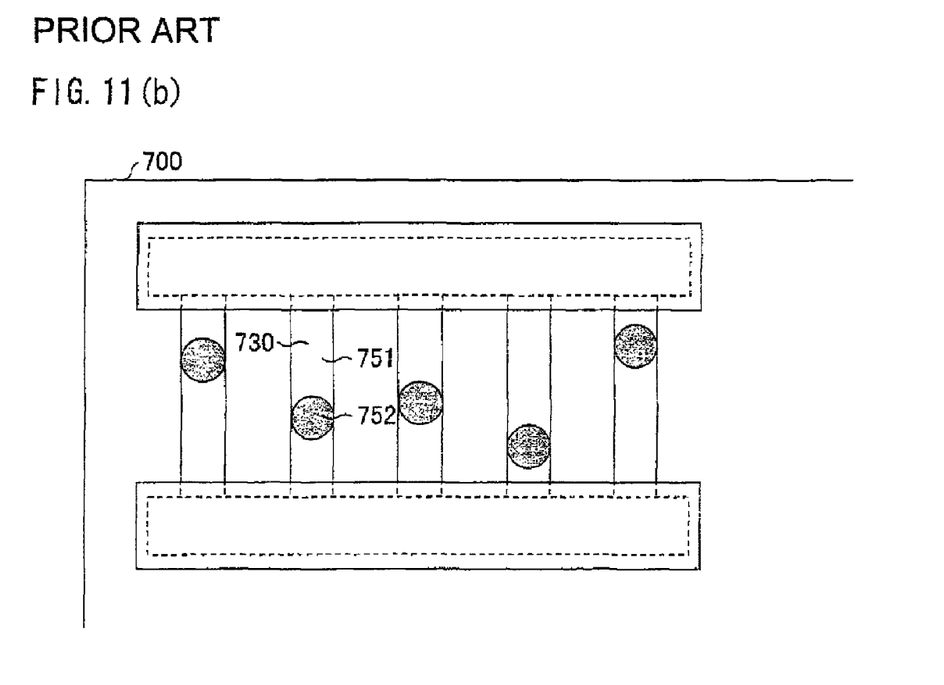
FIG. 11(b) is a plan view showing a case where the circuit board illustrated in FIG. 11(a) includes a solder pre-coat thereon.

FIGS. 11(a) and 11(b) are plan views showing a part of a circuit board, which is used in the flip-chip bonding method adopting the local reflow method. The plan views relate to, in particular, an embodiment of a portion of a bonding pad formed on a circuit board.

In FIG. 11(a), a conductor pattern 720, which constitutes a circuit, is formed on a circuit board 700. A bonding pad 730 is connected to the corresponding conductor patterns 720, and also positioned at such a position that the bonding pad 730 will be connected with a corresponding electrode pad formed on a semiconductor chip. In a region in which the bonding pads 730 is not formed, for example in a region on the conductor patterns 720, a solder resist 740 is provided, which is an insulation film.

For the solder pre-coating of the bonding pad 730, there are known methods according to the local reflow method, such as a Super Jufit method, a Super Solder method, a Screen Printing method and the like.

For example, Japanese Unexamined Patent Application Publication No. 7-74459 (published on Mar. 17, 1995) (Patent Document 2) discloses the Super Jufit method. In the Super Jufit method, the surface of a copper (Cu) pattern, which is formed on the circuit board 700, is treated with a special chemical for making the surface adhesive. Then, solder powder is adhered to the surface. After being coated with flux, the solder is reflowed, thereby being hot-leveled. With these steps, it is possible to carry out solder pre-coating on a copper pattern formed on the bonding pad 730.

Meanwhile, semiconductor chips have been more fine-pitched recently to pitches of less than 50 μm. Accordingly, the distance between the bonding pads 730 is needed to be more fine-pitched as well.

With the distance 731 between the bonding pads 730 fine-pitched, each solder pre-coat on the circuit board 700 can not take a wide region. As a result, in a process of providing a semiconductor chip on the circuit board 700, pre-coated solder could spill from the bonding pads 730, thereby resulting in a short-circuit between the adjacent bonding pads 730 with the spilled solder.

In order to prevent the short-circuit between the bonding pads 730 with the spilled solder, the solder for pre-coating should be reduced in amount. However, the decrease in the amount of the solder for pre-coating reduces an amount of solder contributing to the connection of the bonding pad 730 with a gold wire bump, formed on an electrode pad of a semiconductor chip, thereby resulting in a problem of unstable connections between the gold wire bump and the bonding pad 730.

In order to prevent the decrease of the solder contributing to the connection, another method is proposed. In the method, making bonding pads long can prevent the decrease of the solder contributing to the connection. In this method, the shape of bonding pads is quite long and thin because the width of a bonding pad depends on the distance between the bonding pads.

However, with bonding pads fine-pitched and being long and thin, as FIG. 11(b) shows, molten solder gathers at random positions because of surface tension caused in soldering the semiconductor chip and the bonding pads together. As a result, a solder bump 752 is formed in solder pre-coat 751.

These solder bumps 752 are formed at random positions on the long and thin bonding pads 730. Therefore, a possibility of bonding gold wire bumps of a semiconductor chip and molten solder together successfully decreases, thereby causing bad connections.

Figure 12A:
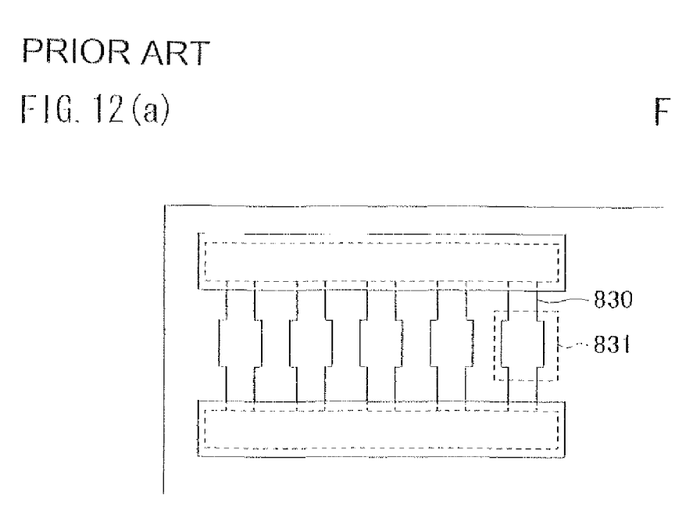
FIG. 12(a) is a plan view of a conventional circuit board.

Japanese Unexamined Patent Application Publication No. 2000-77471 (published on Mar. 14, 2000) (Patent Document 3) discloses a technique in which a portion of a bonding pad 830 is formed wide, as illustrated in FIG. 12(a). With the technique, molten solder gathers on the widen portion 831 of the bonding pad 830. According to Japanese Unexamined Patent Application Publication No. 2005-11902 (published on Jan. 13, 2005) (Patent Document 4), as FIG. 12(b) shows, a widen portion 832 is made by protruding one of the long sides of a bonding pad 830.

Figure 12B:
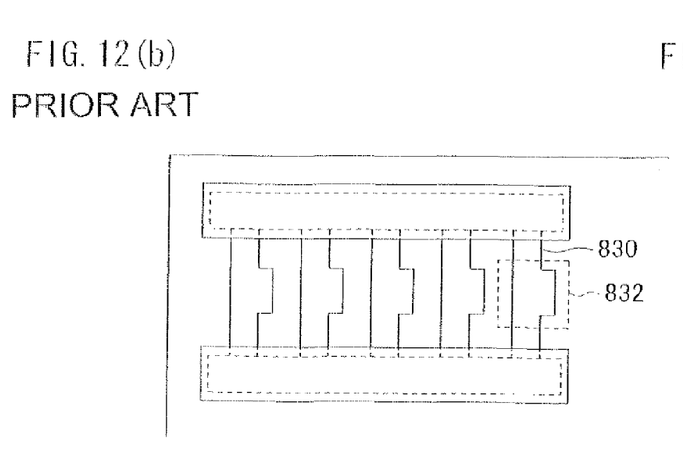
FIG. 12(b) is a plan view of a conventional circuit board.
Figure 12C:
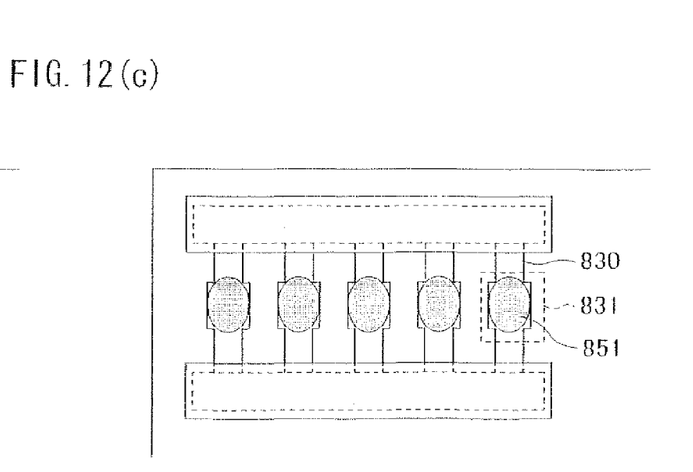
FIG. 12(c) is a plan view showing a case where the circuit board illustrated in FIG. 12(a) includes a solder pre-coat thereon.

In the arts described in these patent documents, the widen portion 831, as FIG. 12(a) shows, (or the widen portion 832, as FIG. 12(b) shows), is formed in such a manner that the widen portion 831 (or the widen portion 832) will face a gold wire bump of a semiconductor chip when the solder-bonding is carried out. As FIG. 12(c) shows, molten solder 851 tends to gather on the widen portion 831, so as to make it possible to increase the amount of the solder contributing to the solder bonding.

In addition, Japanese Unexamined Patent Application Publication No. 9-293957 (published on Nov. 11, 1997) (Patent Document 5) discloses a method, in which pads for storing solder are formed with lead wires from electrode pads. In the method, solder from the pads is used for soldering electrode pads.

However, with the conventional arrangements described above, it is difficult to make a circuit board, with which it is possible to narrow the connection distance between the electrodes of a semiconductor device, and also to have a sufficient thickness of the solder pre-coat for the soldering process at the same time.

For example, the bonding pads disclosed in Patent Document 3 or Patent Document 4, have such a shape that the narrower connection distance between the electrodes of the semiconductor device results in the reduction of the distance between adjacent bonding pads. This phenomenon occurs significantly in case where a further wider portion of a bonding pad is formed so that more solder is used to bond the connection pad to a gold wire bump of a semiconductor.

Figure 12D:
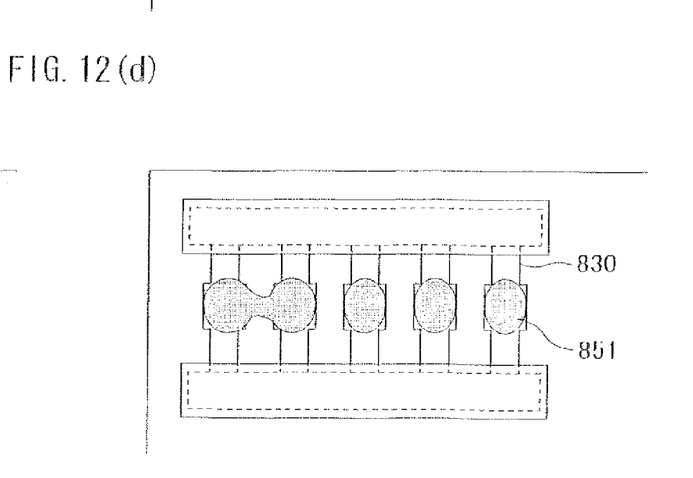
FIG. 12(d) is a plan view showing a case where a solder pre-coat illustrated in FIG. 12(c) connects adjacent bonding pads.

As FIG. 12(d) shows, with the reduction of the distance between bonding pads, the pre-coated solder would be spilled from a bonding pad 830, thereby causing a short-circuit between the adjacent bonding pads 830.

Figure 13A:
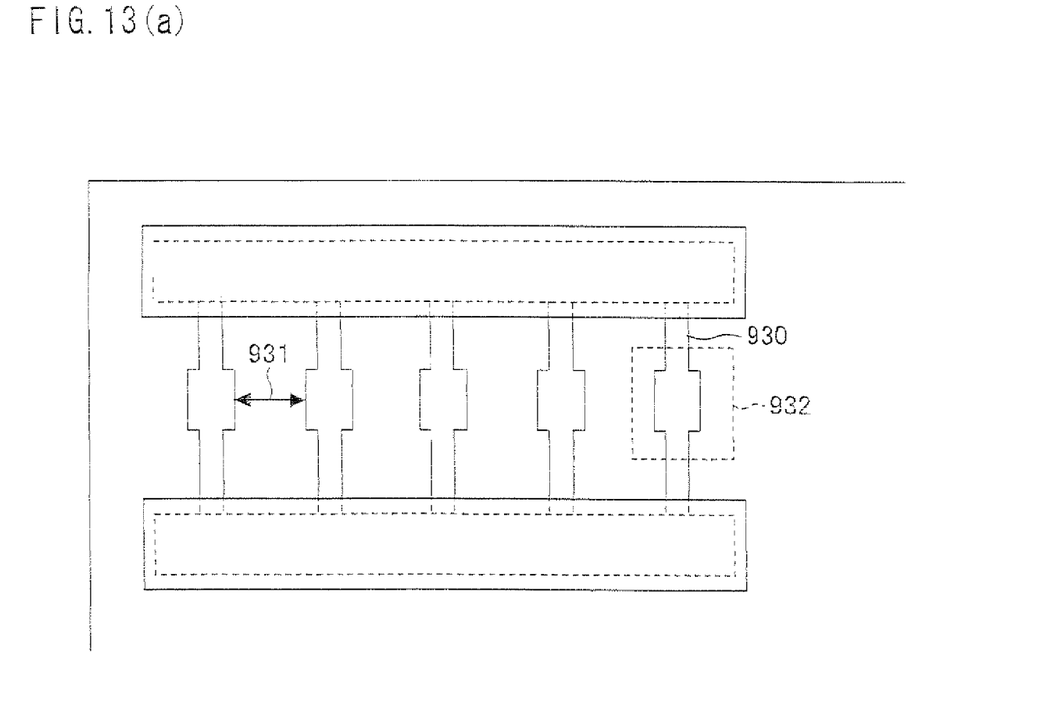
FIG. 13(a) is a plan view of a conventional circuit board.
Figure 13B:
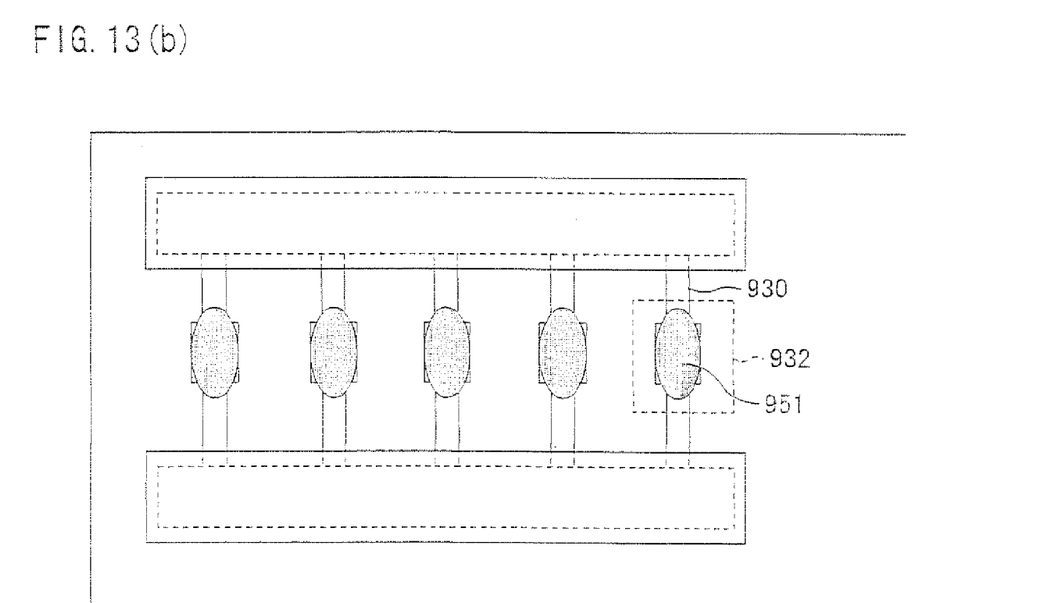
FIG. 13(b) is a plan view showing a case where the circuit board illustrated in FIG. 13(a) includes a solder pre-coat thereon.

In order to prevent the short-circuit with spilled solder, there could be an arrangement in which, as illustrated in FIG. 13(a), a bonding pad 930 is formed narrower, so as to make it possible to widen the distance 931 between the adjacent bonding pads 930. In this case, however, as FIG. 13(b) shows, molten solder 951 melted at a widen portion 932 is reduced in amount. As a result, the solder contributing to the connection between a gold wire bump and the bonding pad 930 is reduced in amount. In short, connection defects would occur because the amount of solder for connecting a gold wire bump to a bonding pad is not sufficient.

SUMMARY

In view of the problems described above, an object of the technology described herein is to provide a circuit board and a method of manufacturing the circuit board, the circuit board and method allowing a further shorter connection distance between electrodes of a semiconductor device, and also allowing a sufficient thickness of a solder pre-coat in a soldering process.

In order to attain the object, a circuit board comprises bonding pads for being connected with bumps of a semiconductor element, which act as connection terminals, the bonding pads being arrayed in parallel lines on a surface of the circuit board, and, on the adjacent parallel lines, the bonding pads being positioned to form a zigzag pattern along the parallel lines longitudinally.

Moreover, in order to attain the object, a method according to the technology described herein is a method of manufacturing a circuit board including bonding pads for being connected with bumps of a semiconductor element, which act as connection terminals. The method comprises forming the bonding pads in parallel lines on a surface of the circuit board, on the adjacent parallel lines, the bonding pads being positioned to form a zigzag pattern along the parallel lines longitudinally.

According to the technology described herein, each of the bonding pads, of which the parallel lines are made, is positioned to form a zigzag pattern along the adjacent parallel lines longitudinally. That is to say, the bonding pads on the adjacent parallel lines are positioned to form a zigzag pattern.

Therefore, it is possible to take a wide distance between each of the bonding pads. In short, each of the bonding pads is so positioned that the bonding pads are hardly short-circuited electrically. That is to say, the technology described herein can provide a circuit board, with which it is possible to form connecting portions with high density, the connecting portions including a plurality of the bonding pads positioned adjacently, and a method of manufacturing the circuit board.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 6(a) is a plan view of a flip-chip board in accordance with another embodiment of the present invention.

DESCRIPTION OF THE EMBODIMENTS

One example embodiment of the technology described herein is described below referring to FIGS. 1(a) to 7(b).

Figure 1A:
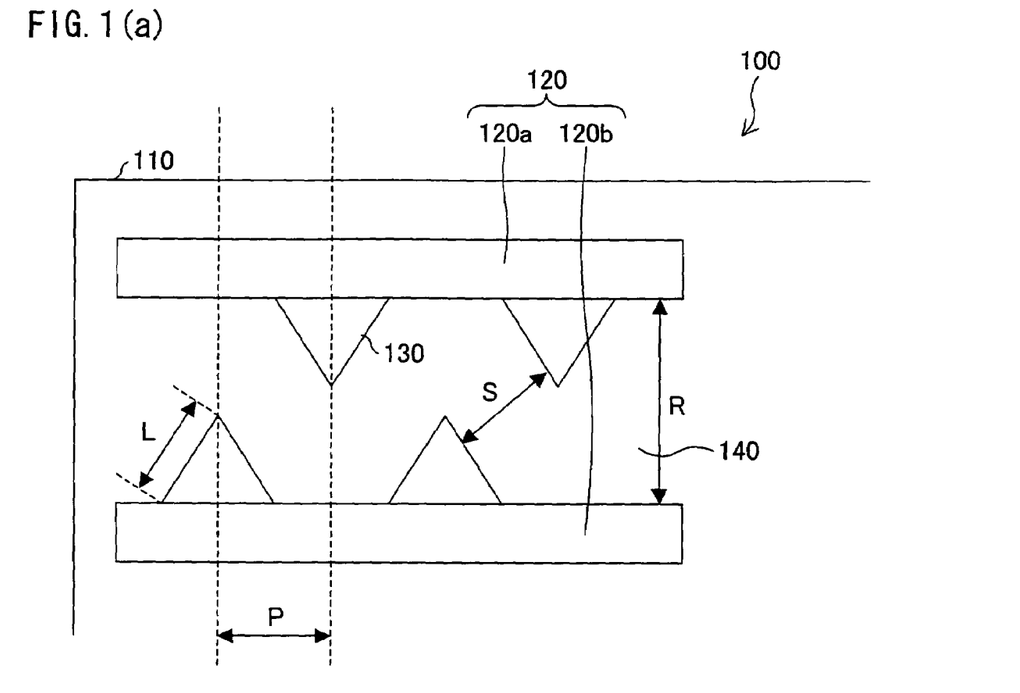
FIG. 1(a) is a plan view of a flip-chip board in accordance with an example embodiment of the technology described herein.
Figure 1B:
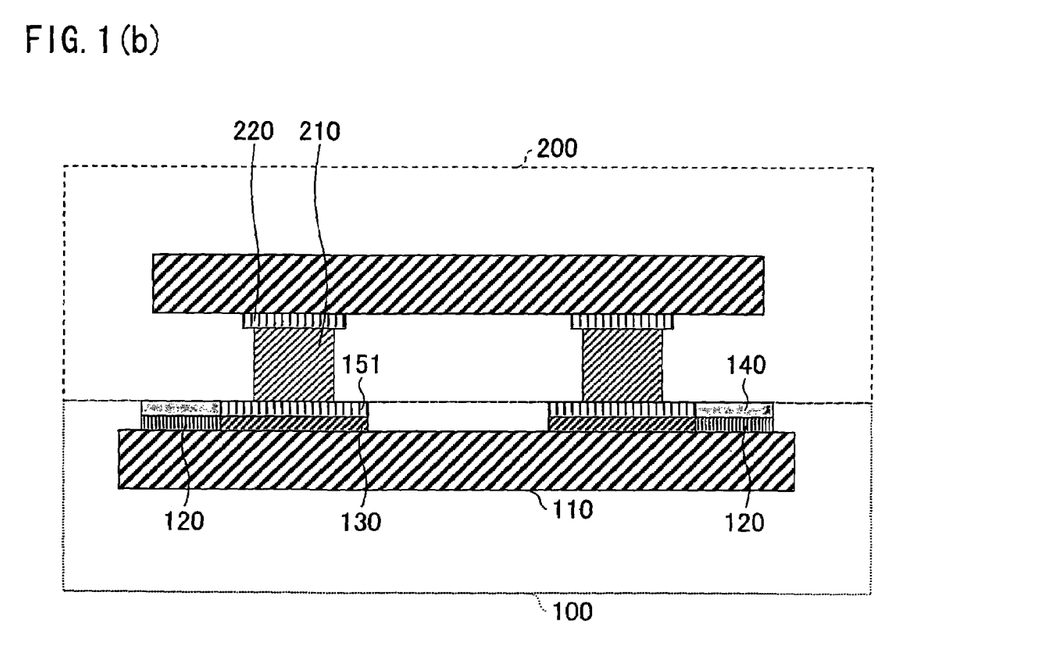
FIG. 1(b) is a cross-section view showing how a flip-chip board and a semiconductor chip are bonded together by a flip-chip bonding.
Figure 2:
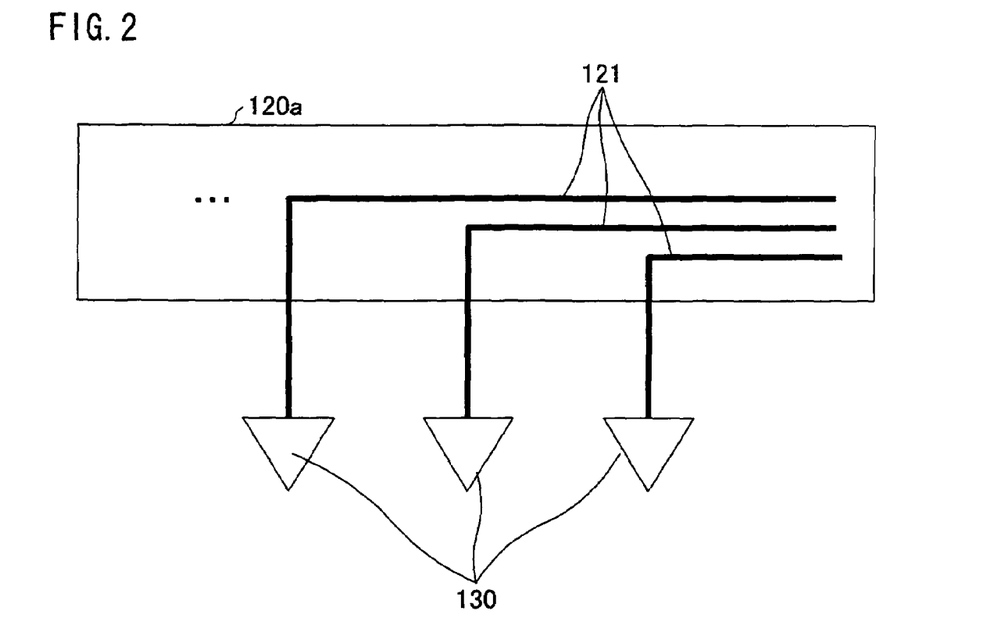
FIG. 2 is a plan view showing the flip-chip board in accordance with an example embodiment of the technology described herein, and a configuration of the conductor pattern illustrated in FIG. 1(a).

FIG. 1(a) is a plan view of a flip-chip board 100 in accordance with an example embodiment of the technology described herein, and FIG. 1(b) is a cross-section view showing a case where the flip-chip board 100 and a semiconductor chip 200 in accordance with the example embodiment of the technology described herein are bonded together by flip-chip bonding.

The flip-chip board (circuit board) 100 in accordance with the example embodiment of the technology described herein includes a circuit pattern (not shown in FIGS. 1(a) and 1(b)) provided on a surface of a board 110, and a plurality of conductor patterns 120 (which are lead wires; FIG. 1(a) shows two conductor patterns, 120a and 120b) electrically connected to the circuit pattern. On each of the conductor patterns 120, a bonding pad 130 is provided. The bonding pad 130 electrically connects a bump 210 of a semiconductor chip 200 and the flip-chip board 100 as illustrated in FIG. 1(b), in the example embodiment. The bump 210 is formed on an electrode pad 220 provided on the semiconductor chip 200 (a semiconductor element). The electrode pad 220 is made of a well-known material, such as copper, aluminum or the like. Further, the bump 210 may be, for example, a gold bump, however another well-known bump may be used.

The board 110 may be, for example, a substrate whose base material is glass fabric material and whose insulating layer is a resin polymer prepared by curing an organic member applied on the base material by immersing the base material in the organic member. The organic member may be epoxy resin, BT (bismaleimide triazine) resin or the like. A board made of an insulating tape, such as TCP (Tape Carrier Package), COF (Chip on Film) or the like, or another well-known board also can be used as the substrate 110.

The conductor patterns 120 are wiring patterns for electrical connections between the circuit pattern formed on the surface of the board 110, and the bonding pads 130. The circuit pattern is not shown in FIGS. 1(a) and 1(b). With the flip-chip board 100 in accordance with the example embodiment, as FIG. 1(a) shows, the conductor patterns 120a and 120b are provided parallel to each other. However, the shape of these conductor patterns 120 is variable in accordance with the shape of the bump 210 formed on the semiconductor chip 200, which is electrically connected to the conductor patterns 120.

Further, the conductor patterns 120 are electrically connected respectively with bonding pads 130, which are to be electrically connected respectively with the bumps 210 of the semiconductor chip 200. For example, as in FIG. 2, the conductor pattern 120a is made of a plurality of conductor wirings 121, and the conductor wirings 121 are electrically connected to the bonding pads 130, respectively. The conductor wirings 121 may be made of, for example, copper, aluminum, or another well-known wiring material.

Further, as FIGS. 1(a) and 1(b) show, solder resist 140, which is an insulation film, covers that surface of each of the conductive patterns 120 and the surface of the board 110 on which the bonding pads 130 are not formed.

The bonding pad 130 is an electrode for electrically connecting the circuit pattern (not illustrated) formed on the flip-chip board 100 according to the example embodiment, and the bump 210 of the semiconductor chip 200. The bonding pad 130 comprises, for example, copper, aluminum, or another well-known wiring material.

With the flip-chip board 100 in accordance with the example embodiment, the shape of the bonding pad 130 is equilateral triangle of side 50 μm, and the distance P (pitch) between the adjacent bonding pads 130 is 50 μm. The bonding pad 130 provided to the conductor pattern 120a is referred to as a bonding pad 130a and the bonding pad 130 provided with the conductor pattern 120b is referred to as a bonding pad 130b. The bonding pads 130a and 130b are provided oppositely and alternatively (as if to form a zigzag pattern) along a longitudinal direction of the conductor patterns 120; see FIG. 3. In short, the bonding pads 130a and 130b are provided to form a zigzag pattern along the longitudinal direction of the conductor patterns 120a and 120b.

Figure 3:
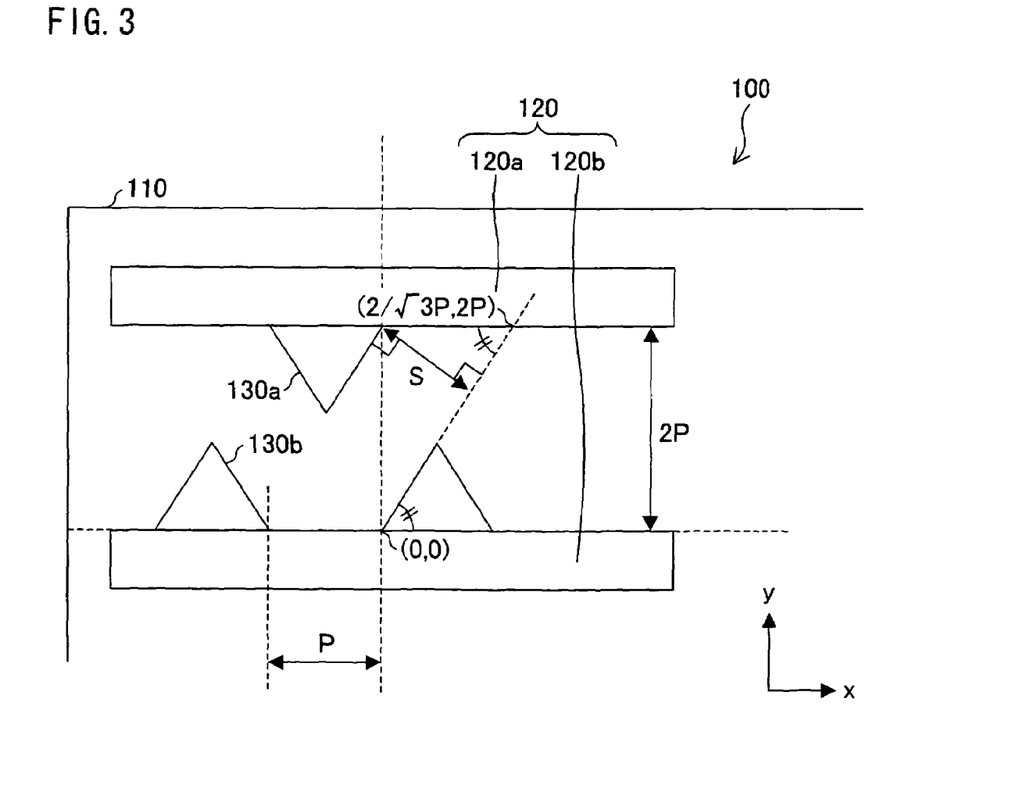
FIG. 3 is a plan view showing the flip-chip board in accordance with an example embodiment of the technology described herein, and a method for measuring a distance between the bonding pads illustrated in FIG. 1(a).

In other words, along the longitudinal direction of the conductor patterns 120a and 120b, a peak of a bonding pad 130b is positioned at a midpoint between the two adjacent equilateral triangles of the bonding pads 130a provided to the conductor pattern 120a. The peak is that one of the vertexes of the bonding pad 130b which is not touched with the conductor pattern 120b, which faces the conductor pattern 120a.

The example embodiment is arranged such that the distance between the conductor patterns 120a and 120b (opening width R) is 100 μm, which is twice the length of pitch P. The length of the opening width R is arbitral as long as the bonding pads 130a and 130b do not touch each other.

Accordingly, the distance S between a bonding pad 130a and 130b is determined geometrically from positional relationship therebetween, as illustrated in FIG. 3.

FIG. 3 is a plan view illustrating the triangle of the bonding pads 130b, where that left vertex of the triangle on which is attached with the conductor pattern 120b is at the origin (0,0). In FIG. 3, the conductor pattern 120b and the conductor pattern 120a are parallel to each other wherein the conductor pattern 120a is over the conductor pattern 120b in FIG. 3, and the x-axis is along the longitudinal direction of the conductor pattern 120a and the y-axis is vertical to the longitudinal direction of the conductor pattern 120.

A straight line from the origin along one of the sides of a bonding pad 130b intersects with a long side of the conductor pattern 120a at coordinates (2P/√3, 2P). A length of a line, which is extended perpendicularly from the straight line described above to the bonding pad 130a, is the distance S between the bonding pads 130a and 130b. Therefore, the distance S can be expressed as:

$$S = 2P/\sqrt{3} \times \sin 60°$$
$$= P$$

The distance S between adjacent bonding pads 130a and 130b is 50 μm, because the pitch P is 50 μm.

According to a conventional method, for example, as in FIG. 12(a), in a case where the pitch between bonding pads is 50 μm, bonding pads are needed to be formed in such a manner that 50 μm is the sum of the distance between adjacent bonding pads and the width of the bonding pad along the longitudinal direction.

On the other hand, the flip-chip board 100 according to the example embodiment is configured such that, if the pitch P between bonding pads is 50 μm as described above, the distance S between the bonding pads 130a and 130b can be 50 μm. That is to say, it is possible to have the distance S longer and also make the bonding pads bigger than with the conventional method.

In addition, as FIG. 1(b) shows, in a case where the semiconductor chip 200 is connected to the flip-chip board 100 according to the example embodiment by flip-chip bonding, it is needed that the bumps 210 formed on the semiconductor chip 200 should be provided in a zigzag pattern so that the bumps 210 are positioned to match with the bonding pads 130.

Figure 4:
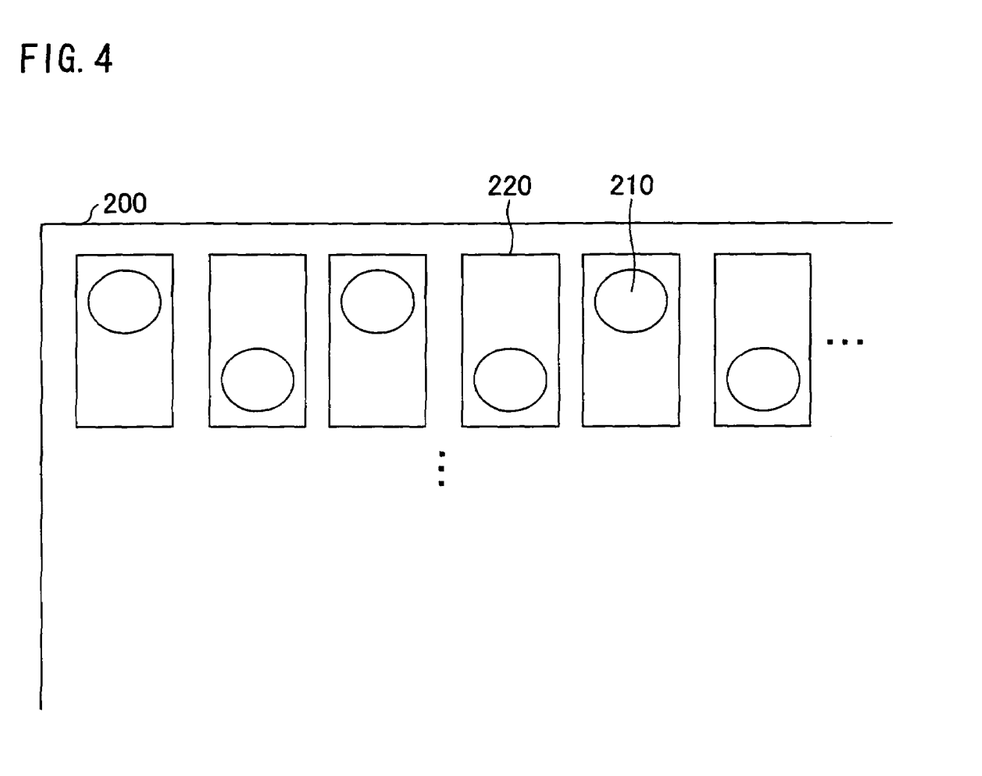
FIG. 4 is a plan view showing the semiconductor chip illustrated in FIG. 1(b) for the flip-chip board in accordance with an example embodiment of the technology described herein.

FIG. 4 is a plan view of the semiconductor chip 200 in accordance with the example embodiment.

With the semiconductor chip 200 in accordance with the example embodiment, the bumps 210 are formed in the zigzag pattern on the electrode pads 220 in accordance with the positions of the bonding pads 130 illustrated in FIG. 1(a).

Usually the semiconductor chip 200 is tested by a wafer test or the like test before it is mounted on the flip-chip board 100 or the like. Further, the semiconductor chip 200 according to the example embodiment is supposed that the interval (pad pitch) of the electrode pads 220 is fine-pitched to 50 μm or less.

The bump 210 to be formed on the semiconductor chip 200 that is fine-pitched as described above is formed in a quite small size. Therefore, if the bump 210 is formed on a portion deformed by probing in the wafer test described above, the formation of the bumps 210 would be unstable. Consequently, the bump 210 is generally formed in the region that is not used in the wafer test.

In the embodiment of the technology described herein, the semiconductor chip 200 is probed with a probe zigzagedly so as to avoid the regions, on which the bumps are to be formed. As FIG. 4 shows, the bumps 210 are formed in the zigzag pattern in accordance with the positions of the bonding pads 130 but not in the regions that the probe touched.

Described below is a method for bonding the flip-chip board 100 and the semiconductor chip 200 according to the present embodiment by a flip-chip bonding method.

Figure 5A:
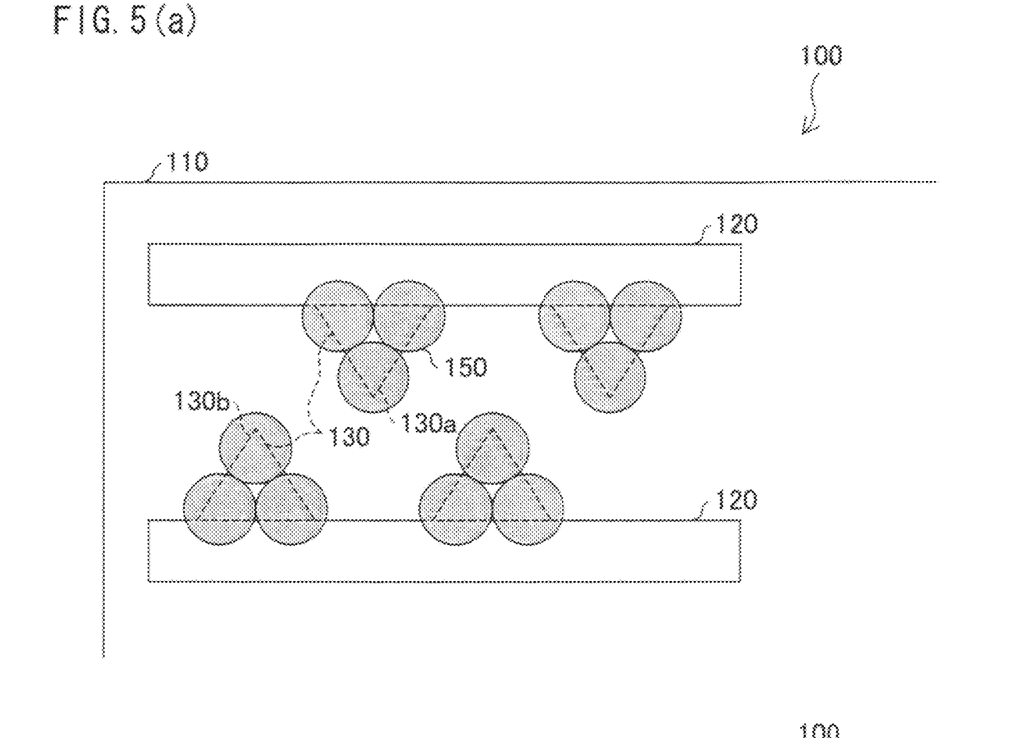
FIG. 5(a) is a plan view showing a case where solder powder is adhered to the bonding pads illustrated in FIG. 1(a).
Figure 5B:
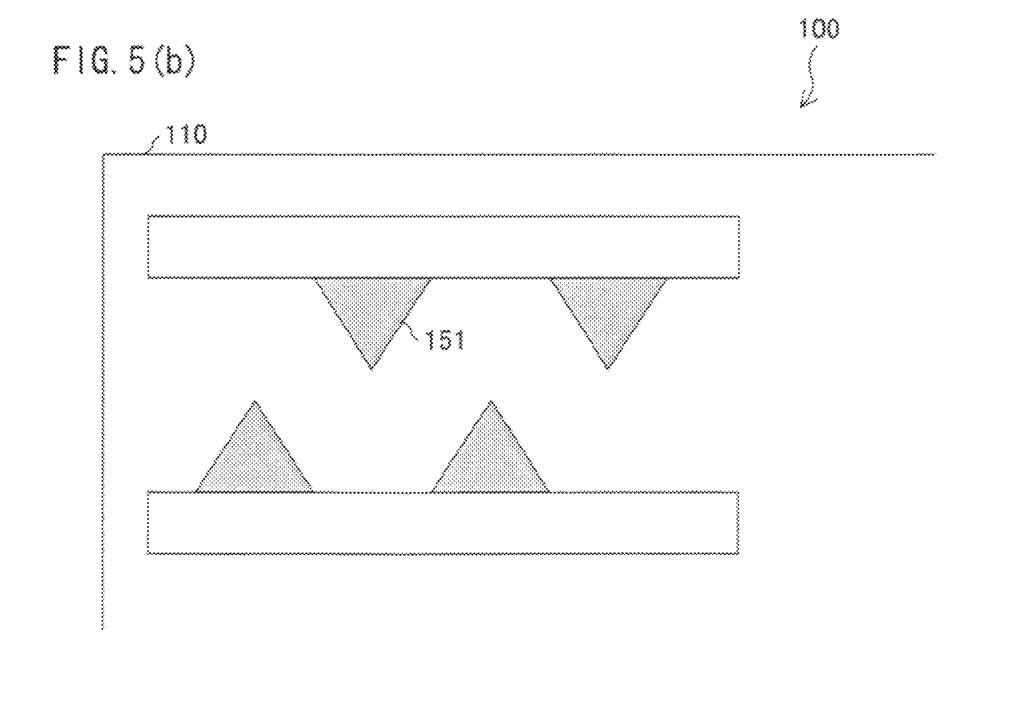
FIG. 5(b) is a plan view showing a case where the solder powder of FIG. 5(a) is melted, thereby forming a solder pre-coat.
Figure 6A:
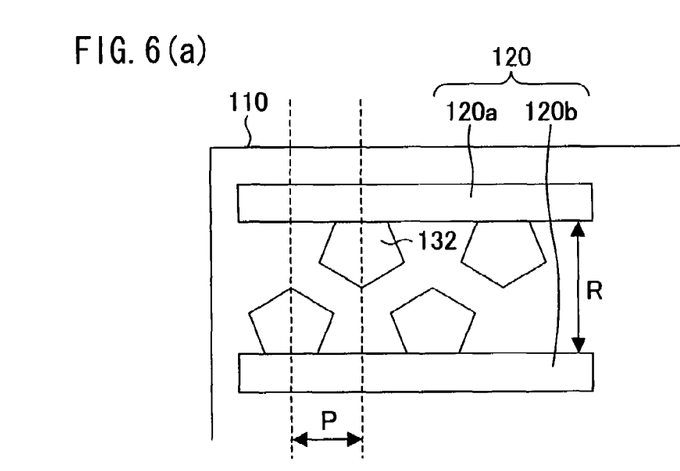
FIG. 6(a) is a plan view of a flip-chip board in accordance with another example embodiment of the technology described herein.
Figure 6B:
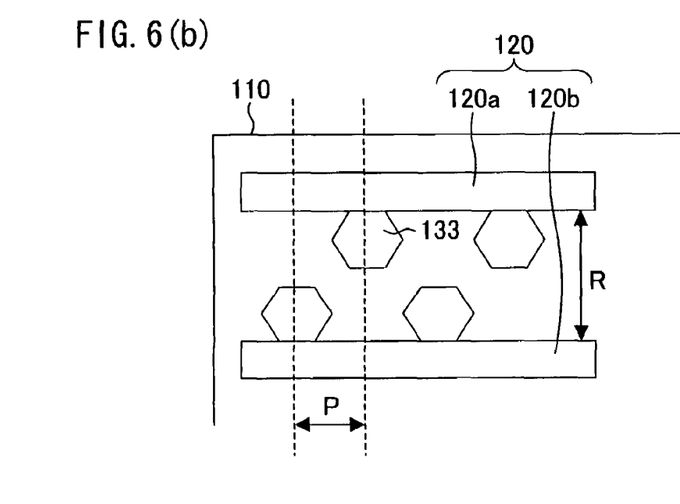
FIG. 6(b) is a plan view of a flip-chip board in accordance with still another example embodiment of the technology described herein.
Figure 6C:
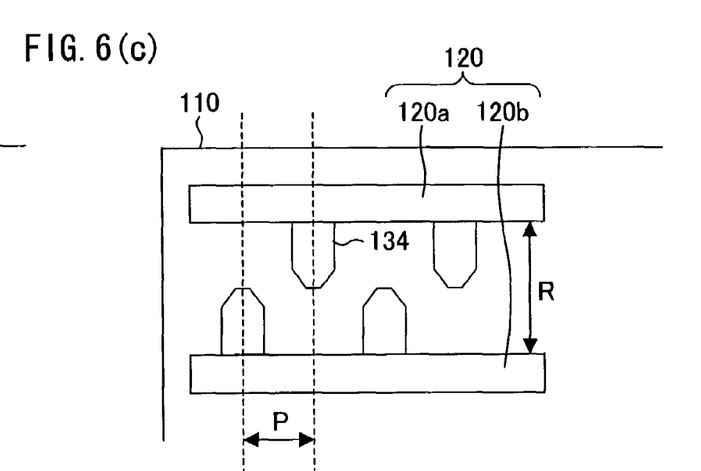
FIG. 6(c) is a plan view of a flip-chip board in accordance with yet another example embodiment of the technology described herein.
Figure 6D:
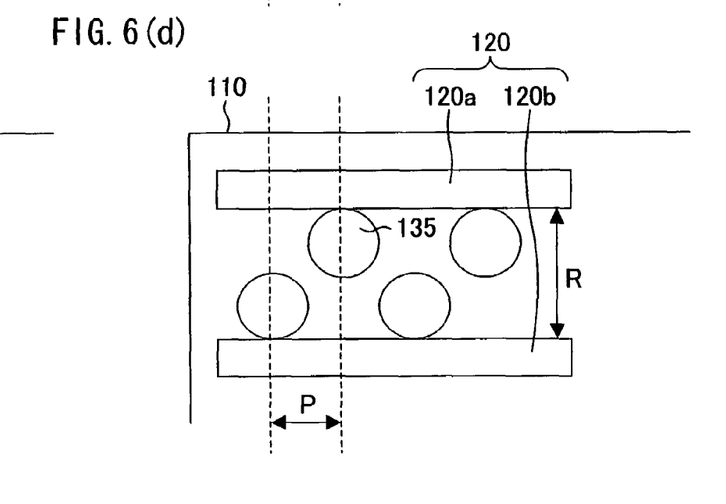
FIG. 6(d) is a plan view of a flip-chip board in accordance with still yet another example embodiment of the technology described herein.

FIG. 5(a) is a plan view illustrating how solder powder 150 is provided on the flip-chip board 100 in accordance with the present embodiment, and FIG. 5(b) is a plan view illustrating how the solder powder 150 is melted to form a solder pre-coat 151.

In the flip-chip board 100 in accordance with the present embodiment, the amount of the solder pre-coat 151 formed on the bonding pads 130 is preferably small in order to prevent a short-circuit of the adjacent bonding pads 130 with the solder in a case where the semiconductor chip 200 and the flip-chip board are bonded together by flip-chip bonding. However, in order to solder the bumps 210 on the semiconductor chip 200 to the bonding pads 130 with sufficient strength, it is preferable to use solder as much as possible for pre-coating of the bonding-pads 130.

Patent Document 2 discloses the Super Jufit method, which is one of methods capable of attaining most fine pitches, among solder pre-coating methods.

In the Super Jufit method, a surface of wiring patterns formed on a circuit board is treated with a special chemical so as to cause the surface adhesive. Then, the solder powder is adhered the surface. After coating the circuit board with flux, the solder is reflowed so as to hot-level the solder. Therefore, the solder pre-coat can have various thickness by changing an average particle size of the solder powder from which the solder pre-coat will be formed.

For example, in a case where the average particle size of the solder powder is 20 μm, the thickness of the solder pre-coat will be approximately 16 μm. In a case where the average particle size of the solder powder is 30 μm, the thickness of the solder coating will be approximately 18 μm. In a case where the average particle size of the solder powder is 40 μm, the thickness of the solder pre-coat will be approximately 20 μm. In a case where the average particle size of the solder powder is 50 μm, the thickness of the solder pre-coat will be approximately 30 μm.

Conventionally, in a case where the pitch between bonding pads is 50 μm, the sum of the distance between adjacent bonding pads and the width of the bonding pad is adjusted to 50 μm. Consequently, the particle size of the solder powder should be approximately 20 μm, whereby the thickness of the solder pre-coat is approximately 16 μm.

With the flip-chip board 100 according to the present embodiment, the distance S between the adjacent bonding pads 130a and 130b is 50 μm, as described above. Therefore, with the Super Jufit method, it is possible to provide the solder powder 150, whose particle size is approximately in a range of 40 to 50 μm, on the bonding pads 130. In this case, it is possible to form the solder pre-coat 151, whose thickness is approximately in a range of 20 to 30 μm, on the surface of the bonding pads 130.

Moreover, as FIG. 5(*a*) shows, the solder pre-coat 151 may be formed by placing a plurality of particles of the solder powder 150 on the surface of the bonding pads 130a and 130b.

In this case, as illustrated in FIG. 1(*b*), the surface of the conductor patterns 120 adjacent to the bonding pads 130 and the surface of the board 110 on which no bonding pads 130 are formed are covered with solder resist 140. As a result, the solder, which is melted in the reflow process, gathers around the center of the bonding pads 130 because of surface tension. With the flip-chip board in accordance with the present embodiment, the shape of the bonding pad 130 is equilateral polygon (in FIG. 1(*a*), the shape of the bonding pads is equilateral triangle), therefore, the solder pre-coat 151 is formed thicker at the centers of the bonding pads 130.

In short, with the flip-chip board 100 in accordance with the present embodiment, it is possible to form the solder pre-coat 151 with the solder powder 150, whose particle size is almost the same as the pitch P between the adjacent bonding pads 130. Therefore, it is possible to form the solder pre-coat with more sufficient solder than with a conventional method, and also to prevent the solder from causing short-circuit between the adjacent bonding pads 130.

Further, in the aforementioned case, the shape of bonding pads is equilateral triangle. However, the bonding pads of the technology described herein may have other shapes, as illustrated in the plan views of FIGS. 6(*a*) to 6(*d*). For example, the bonding pads may have an equilateral pentagonal shape as bonding pads 132 illustrated in FIG. 6(*a*), or the bonding pads may have an equilateral hexagonal shape as bonding pads 133 illustrated in FIG. 6(*b*). The bonding pads may have an non-equilateral hexagonal shape as bonding pads 134 illustrated in FIG. 6(*c*), whose shape is as if being made by straightly beveling a pair of adjacent vertexes of a rectangle. The bonding pads may have a circular shape as bonding pads 135 illustrated in FIG. 6(*d*).

Moreover, the pitch P between adjacent bonding-pads and the opening width R between the conductor patterns 120a and 120b can be arbitrarily set.

Figure 7A:
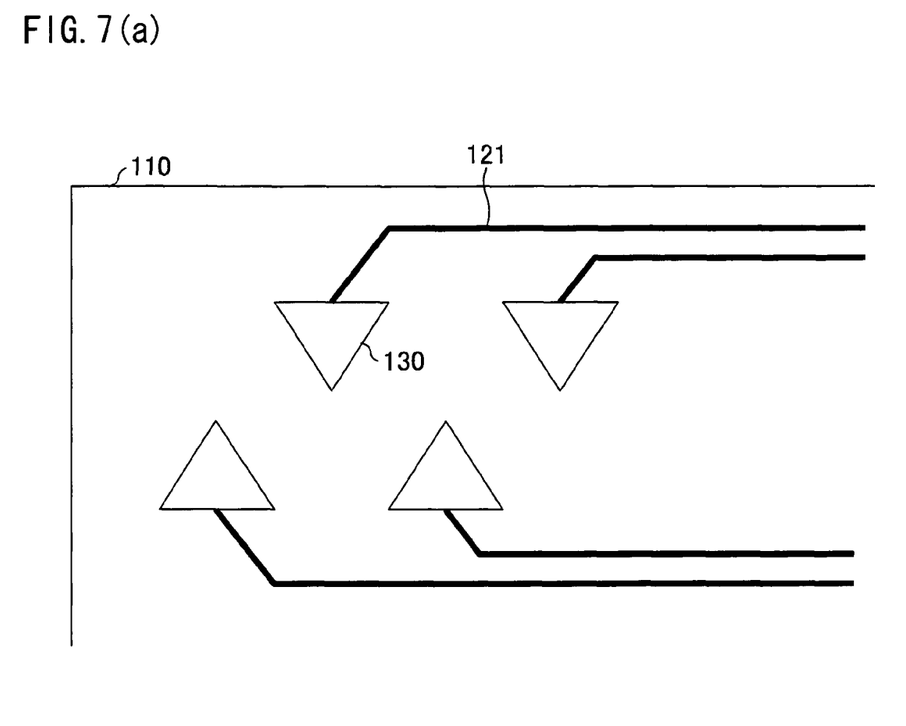
FIG. 7(a) is a plan view of a flip-chip board in accordance with yet still another example embodiment of the technology described herein.
Figure 7B:
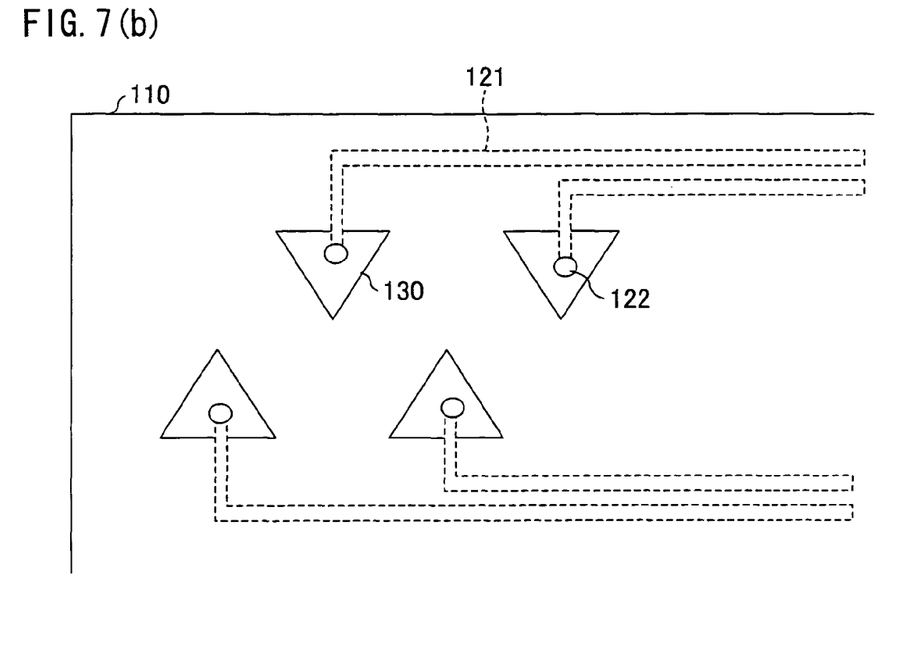
FIG. 7(b) is a plan view of a flip-chip board in accordance with a further another example embodiment of the technology described herein.

In addition, in accordance with the aforementioned embodiment, the bonding pads are provided along the conductor pattern 120 or the like. However, the technology described herein is not limited to this, provided that the lines of the arrayed bonding pads are schematically parallel to each other. In this case, it is preferable that the conductor patterns be so positioned that a short-circuit of a plurality of bonding pads, conductor patterns and the like will not occur in the solder pre-coating process. For example, conductor patterns may be formed outwardly with respect to the (substantially) paralleled lines of the bonding pads as illustrated FIG. 7(*a*), or through electrodes 122 may be formed, which are extended through a circuit board thereby to electrically connect the bonding pads with the conductor patterns located, for example, on the other side of the circuit board, as illustrated in FIG. 7(*b*).

The technology described herein is not limited to the description of the embodiments above, but may be altered by a skilled person within the scope of the claims. An embodiment based on a proper combination of technical means disclosed in different embodiments is encompassed in the technical scope of the technology described herein.

As described above, in accordance with an embodiment of the technology described herein, the bonding pads for flip-chip bonding are respectively formed to face conductor patterns facing each other, and the bonding pads, which face different conductor patterns, are provided alternatively (to form a zigzag pattern). As a result, the technology described herein can use more sufficient solder for pre-coating bonding pads than a conventional method, and also prevent the solder from causing a short-circuit between adjacent bonding pads. That is to say, the technology described herein can provide a circuit board, with which it is possible to form connecting portions with high density, the connecting portions including a plurality of the bonding pads positioned adjacently, and a method of manufacturing the circuit board.

Moreover, in accordance with an embodiment of the technology described herein, the circuit board may further comprise a wiring pattern on the circuit board; and lead wires for electrically connecting the bonding pads to the wiring pattern, the lead wires being extended outwardly from the bonding pads arrayed on the adjacent parallel lines.

In accordance with the present embodiment, the lead wires are extended outwardly from the bonding pads arrayed on the adjacent parallel lines. Therefore, the formation of the lead wires will not result in a narrower distance between the lead wires, a narrower distance between the lead wire and the bonding pad, and the like. Thus, the bonding pads can be put in positions, where the bonding pads are hardly electrical short-circuited.

Moreover, the circuit board may comprise a solder layer on the bonding pads.

In accordance with the embodiment of the technology described herein, the solder layer is formed on the bonding pads, therefore, the local reflow method can be used in a flip-chip bonding process, for example.

The circuit board may be configured such that the bonding pads have a polygonal shape.

In accordance with the embodiment, the solder layer can be formed on bonding pads from which molten solder gathers around the centers of the bonding pads formed in a polygonal shape. Consequently, it is possible to increase the solder contributing to the solder connections between the bonding pads and bumps of a semiconductor element.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A circuit board comprising:
    bonding pads for being connected with bumps of a semiconductor element, which act as connection terminals,
    the bonding pads being arrayed in parallel lines on a surface of the circuit board, and
    on the parallel lines that are adjacent to each other, the bonding pads being positioned to form a zigzag pattern along the parallel lines longitudinally,
    the bonding pads being further positioned so that (i) adjacent ones of bonding pads, arrayed in each of the parallel lines, are separated from each other by a pitch P, (ii) adjacent ones of bonding pads, positioned oppositely and alternatively in adjacent ones of the parallel lines respectively, are separated by a distance S, and (iii) the pitch P and the distance S are substantially equal to each other.

2. The circuit board according to claim 1, further comprising:
    a wiring pattern on the circuit board; and
    lead wires for electrically connecting the bonding pads to the wiring pattern,
    the lead wires being extended outwardly from the bonding pads arrayed on the parallel lines that are adjacent to each other.

3. The circuit board according to claim 1, comprising a solder layer on each of the bonding pads,
    the solder layer being formed from a solder powder whose particle size is essentially the same as the pitch P.

4. The circuit board according to claim 1, wherein each of the bonding pads has an equilateral polygonal shape other than an equilateral tetragonal shape.

5. The circuit board according to claim 4, wherein each of the bonding pads has one of an equilateral triangular shape, an equilateral pentagonal shape, and an equilateral hexagonal shape.

6. A method of manufacturing a circuit board including bonding pads for being connected with bumps of a semiconductor element, which act as connection terminals, the method comprising:
    forming the bonding pads in parallel lines on a surface of the circuit board;
    on the parallel lines that are adjacent to each other, the bonding pads being positioned to form a zigzag pattern along the parallel lines longitudinally,
    the bonding pads being further positioned so that (i) adjacent ones of bonding pads, arrayed in each of the parallel lines, are separated from each other by a pitch P, (ii) adjacent ones of bonding pads, positioned oppositely and alternatively in adjacent ones of the parallel lines respectively, are separated by a distance S, and (iii) the pitch P and the distance S are substantially equal to each other.

7. The method according to claim 6, further comprising forming a solder layer on each of the bonding pads, the solder layer being formed from a solder powder whose particle size is the same as the pitch P.

8. The method according to claim 5, wherein each of the bonding pads has an equilateral polygonal shape other than an equilateral tetragonal shape.

9. The method according to claim 8, wherein each of the bonding pads has one of an equilateral triangular shape, an equilateral pentagonal shape, and an equilateral hexagonal shape.

* * * * *